US010691865B2

(12) United States Patent
Huda et al.

(10) Patent No.: US 10,691,865 B2
(45) Date of Patent: Jun. 23, 2020

(54) MODIFYING LAYOUT BY REMOVING FILL CELL FROM FILL-DENSE REGIONS AND INSERTING DUPLICATE IN TARGET FILL REGION

(71) Applicant: GLOBALFOUNDRIES INC., Grand Cayman (KY)

(72) Inventors: Gazi M. Huda, Halfmoon, NY (US); Samuel O. Nakagawa, Redwood City, CA (US)

(73) Assignee: GLOBALFOUNDRIES INC., Grand, Cayman (KY)

( * ) Notice: Subject to any disclaimer, the term of this patent is extended or adjusted under 35 U.S.C. 154(b) by 94 days.

(21) Appl. No.: 16/013,403

(22) Filed: Jun. 20, 2018

(65) Prior Publication Data

US 2019/0392110 A1    Dec. 26, 2019

(51) Int. Cl.
*G06F 17/50* (2006.01)
*G06F 30/398* (2020.01)
*H01L 21/321* (2006.01)
*H01L 27/02* (2006.01)
*G03F 7/20* (2006.01)

(52) U.S. Cl.
CPC ........ *G06F 30/398* (2020.01); *H01L 21/3212* (2013.01); *H01L 27/0207* (2013.01); *G03F 7/70441* (2013.01)

(58) Field of Classification Search
CPC .................................................. G06F 17/5081
USPC .......................................................... 716/119
See application file for complete search history.

(56) References Cited

U.S. PATENT DOCUMENTS

| 7,509,622 | B2 | 3/2009 | Sinha et al. |
| 8,627,245 | B1 | 1/2014 | Banerjee et al. |
| 2004/0064797 | A1 | 4/2004 | Li |
| 2009/0055793 | A1* | 2/2009 | Melzner ............. G06F 17/5077 716/130 |
| 2009/0241085 | A1 | 9/2009 | De La Cruz et al. |
| 2013/0080980 | A1 | 3/2013 | Wang et al. |
| 2019/0005180 | A1* | 1/2019 | Yeh ....................... G06F 30/398 |
| 2019/0340326 | A1* | 11/2019 | Huda .................. H01L 21/3212 |

OTHER PUBLICATIONS

Nishant Dhumane, "Critical Area Driven Dummy Fill Insertion to Improve Manufacturing Yield", Masters Theses 1911, University of Massachusetts Amherst, 61 pages (Feb. 2014).

(Continued)

*Primary Examiner* — Suchin Parihar
(74) *Attorney, Agent, or Firm* — Anthony Canale; Hoffman Warnick LLC

(57) ABSTRACT

The disclosure provides a method including: identifying a fill-dense region of an integrated circuit (IC) layout having a plurality of fill cells, and a target fill region of the IC layout adjacent to the fill-dense region and free of fill cells; modifying the IC layout by removing a fill cell from the fill-dense region and inserting a duplicate of the removed fill cell within the target fill region to at least partially fill the target fill region; and providing instructions to manufacture an IC using the modified IC layout. The method may reduce a feature density of the fill-dense region to less than an allowable feature density, while adding fill features to otherwise unfillable regions.

20 Claims, 9 Drawing Sheets

(56) References Cited

OTHER PUBLICATIONS

Huang-Yu Chen, Szu-Jui Chou, Yao-Wen Chang, "Density Gradient Minimization with Coupling-Constrained Dummy Fill for CMP Control", pp. 105-110 (2010).
Tung-Chieh Chen, Minsik Cho, David Z. Pan and Yao-Wen Chang, "Metal-Density-Driven Placement for CMP Variation and Routability", (vol. 27), pp. 2145-2155 (2008).
U.S. Appl. No. 15/971,280, Office Action dated Sep. 30, 2019, 9 pages.

* cited by examiner

MODIFYING LAYOUT BY REMOVING FILL CELL FROM FILL-DENSE REGIONS AND INSERTING DUPLICATE IN TARGET FILL REGION

BACKGROUND

Technical Field

The present disclosure relates to integrated circuit (IC) fabrication. More specifically, the present disclosure relates to processes for modifying an IC layout to change the location of fill cells under specific conditions.

Related Art

Fabrication foundries ("fabs") manufacture ICs using photolithographic processes. Photolithography is an optical printing and fabrication process by which patterns on a photolithographic mask (simply "mask" hereafter) are imaged and defined onto a photosensitive layer coating of a substrate. To manufacture an IC, masks are created using an IC layout as a template. The masks contain the various geometries of the IC layout, and these geometries may be separated with layers of photoresist material. The various geometries contained on the masks correspond to the various base physical IC elements that make up functional circuit components such as transistors, interconnect wiring, via pads, as well as other elements that are not functional circuit elements but are used to facilitate, enhance, or track various manufacturing processes. Through sequential use of the various masks corresponding to a given IC in an IC fabrication process, a large number of material layers of various shapes and thicknesses with different conductive and insulating properties may be built up to form the overall IC and the circuits within the IC layout.

The underlying design of an IC layout may greatly affect the quality and consistency of devices produced according to the layout. The total surface area of device features on a layer divided by the total surface of the layer itself, referred to as "feature density," is of particular interest in the manufacture of electronic devices. For example, chemical mechanical planarization (CMP), also known as "polishing," is a process in which portions of a layer are removed non-selectively to create a planarized upper surface. The planarized surface generally needs a minimum feature density in order to implement CMP successfully, and the presence of large gaps without features thereon may increase the risk of manufacturing errors.

One technique for increasing the feature density of a layer is to place non-functional features, known as a "fill region" or individually as "fill cells," on the layer to increase the layer's feature density. Although a fill region is an effective tool to increase feature density, the shape and position of the individual fill cells must comply with a specification for the layer where it is positioned. The specification may define, e.g., an allowable feature density for fill regions, and a threshold of non-filled surface area. These requirements sometimes compete with each other and impede layout adjustment. IC manufacturing conventionally includes analyzing the initial fill region design, followed by iterative rounds of correction and re-design until the structures meet the requirements for a particular product.

SUMMARY

A first aspect of the disclosure provides a method including: determining whether an integrated circuit layout (IC) having a plurality of fill cells includes a target fill region, the target fill region being a region of the IC layout without fill cells and exceeding a threshold surface area; in response to determining that the IC layout includes the target fill region, determining whether the target fill region is positioned adjacent to a fill-dense region, the fill-dense region being a region of the IC layout including a plurality of fill cells, and having a feature density at least equal to an allowable feature density for the IC layout, wherein feature density is defined as the ratio of fill cell surface area within a region to a total surface area of the region; in response to determining that the IC layout does not include the target fill region, or the target fill region not being positioned adjacent to the fill-dense region, providing instructions to manufacture an IC using the IC layout; in response to the target fill region being positioned adjacent to the fill-dense region, modifying the IC layout, wherein the modifying includes: removing one of the plurality of fill cells from the fill-dense region, and inserting a duplicate of the removed one of the plurality of fill cells within the target fill region; determining whether the feature density of the fill-dense region is at least equal to the allowable feature density for the IC layout; in response to determining that the feature density of the fill-dense region is at least equal to the allowable feature density for the IC layout, repeating the modifying of the IC layout; and in response to determining that the feature density of the fill-dense region is less than the allowable feature density of the IC layout, providing instructions to manufacture an IC using the modified IC layout.

A second aspect of the disclosure provides a computer program product stored on a computer readable storage medium, the computer program product including program code, which, when being executed by at least one computing device, causes the at least one computing device to: determine whether an integrated circuit layout (IC) having a plurality of fill cells includes a target fill region, the target fill region being a region of the IC layout without fill cells and exceeding a threshold surface area; in response to determining that the IC layout includes the target fill region, determine whether the target fill region is positioned adjacent to a fill-dense region, the fill-dense region being a region of the IC layout including a plurality of fill cells, and having a feature density at least equal to an allowable feature density for the IC layout, wherein feature density is defined as the ratio of fill cell surface area within a region to a total surface area of the region; in response to determining that the IC layout does not include the target fill region, or the target fill region not being positioned adjacent to the fill-dense region, provide instructions to manufacture an IC using the IC layout; in response to the target fill region being positioned adjacent to the fill-dense region, modify the IC layout by performing actions including: removing one of the plurality of fill cells from the fill-dense region, and inserting a duplicate of the removed one of the plurality of fill cells within the target fill region; determining whether the feature density of the fill-dense region is at least equal to the allowable feature density for the IC layout; in response to determining that the feature density of the fill-dense region is at least equal to the allowable feature density for the IC layout, repeat the modifying of the IC layout; and in response to determining that the feature density of the fill-dense region is less than the allowable feature density of the IC layout, provide instructions for a manufacturing device to manufacture an IC using the modified IC layout.

A third aspect of the present disclosure provides a system including: a computing device; an I/O component operatively coupled to the computing device; and a memory operatively coupled to the computing device, wherein the computing device includes logic and is configured to perform a method including: determining whether an integrated circuit layout (IC) having a plurality of fill cells includes a target fill region, the target fill region being a region of the IC layout without fill cells and exceeding a threshold surface area; in response to determining the IC layout includes the target fill region, determining whether the target fill region is positioned adjacent to a fill-dense region, the fill-dense region being a region of the IC layout including a plurality of fill cells, and having a feature density at least equal to an allowable feature density for the IC layout, wherein feature density is defined as the ratio of fill cell surface area within a region to a total surface area of the region; in response to determining that the IC layout does not include the target fill region, or the target fill region not being positioned adjacent to the fill-dense region, providing instructions to manufacture an IC using the IC layout; in response to the target fill region being positioned adjacent to the fill-dense region, modifying the IC layout, wherein the modifying includes: removing one of the plurality of fill cells from the fill-dense region, and inserting a duplicate of the removed one of the plurality of fill cells within the target fill region; determining whether the feature density of the fill-dense region is at least equal to the allowable feature density for the IC layout; in response to determining that the feature density of the fill-dense region is at least equal to the allowable feature density for the IC layout, repeating the modifying of the IC layout; and in response to determining that the feature density of the fill-dense region is less than the allowable feature density of the IC layout, providing instructions for a manufacturing device to manufacture an IC using the modified IC layout.

Figure 1:
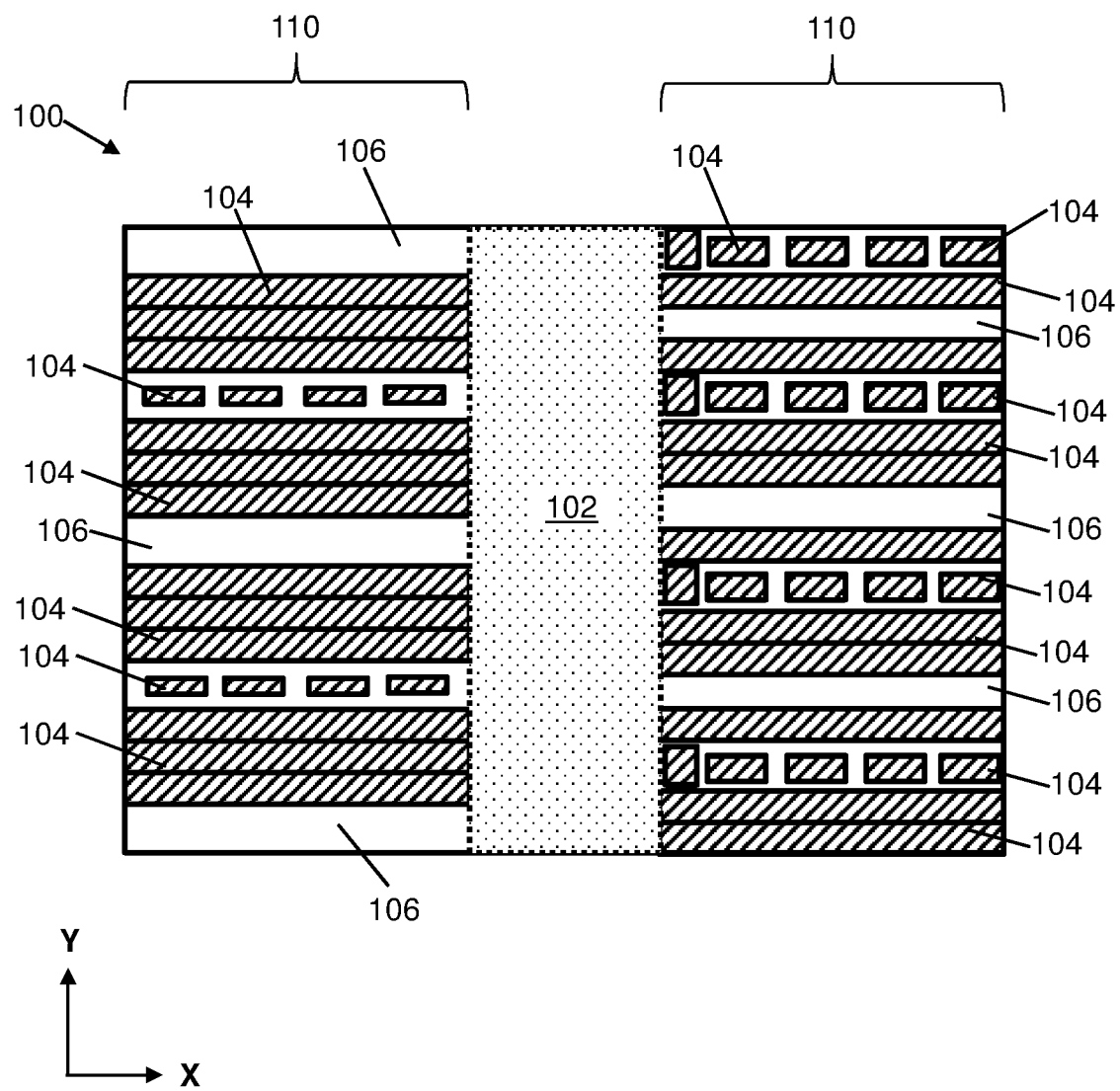
FIG. 1 provides a schematic view of an IC layout to be modified according to embodiments of the disclosure.

It is noted that the drawings of the disclosure are not necessarily to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure pertain to integrated circuit (IC) (alternatively, "circuit") manufacture. More specifically, embodiments of the disclosure pertain to improving the quality of fill regions used in photolithographic processing in IC manufacture and positioned between functional components (e.g., wires, vias, device structures, etc.) of a circuit. Methods according to the disclosure may involve analyzing the fill regions to be formed between other features of a mask, e.g., a dummy fill to provide a consistent feature density across each layer and improve the outcome of planarization. The term "region" generally refers to a subset of an IC layout in two dimensional space, and the boundaries of a region may be defined automatically via modeling software and/or manually by a user. Various measurements, calculated quantities, etc., may be evaluated with respect to specific regions, as opposed to the entirety of a layout. Feature density in particular is calculated, analyzed, etc., with respect to fill-dense regions and target fill regions as discussed in detail below.

The method identifies target fill regions in a layout, e.g., portions of a layout without fill cells and having a surface area that is large enough to affect manufacturing quality of a mask. Target fill regions may be positioned next to another region which has an extremely large number of fill cells distributed over a relatively small surface area. A region with an unusually high feature density being positioned next to a region without fill cells may impair the manufacturability of a mask. Regions with a large number of fill cells within a small portion of the layout may be known as fill-dense regions. Fill-dense regions may exhibit a feature density that is greater than a predetermined allowable density for the region of the layout. To improve manufacturability, one or more fill cells may be removed from the fill-dense region and duplicates of these cells may be added to the target fill region. The modified IC layout with the duplicate fill cells in the target fill region may be stored for future use, e.g., to manufacture other product units or to assist with the design and manufacture of other products.

To better illustrate the various embodiments of the present disclosure, particular terminology which may be known or unknown to those of ordinary skill in the art is defined to further clarify the embodiments set forth herein. The term "system" refers to a computer system, server, etc. composed wholly or partially of hardware and/or software components, one or more instances of a system embodied in software and accessible a local or remote user, all or part of one or more systems in a cloud computing environment, one or more physical and/or virtual machines accessed via the internet, other types of physical or virtual computing devices, and/or components thereof. The terms "layout" or "mask layout" refer to a complete or partial mapping of masking material to be used for forming (e.g., by various combinations of etching, deposition, etc.) a particular layer which includes multiple features ("features"). A "manufacturing specification" refers to any user-defined characteristic(s) for distinguishing masks that are viable for manufacture from masks that are not viable for manufacture. Manufacturing specifications may include a comprehensive listing of such measurements, including for example design features, dimensions of particular regions, desired amounts of space to be occupied by fill cells, performance requirements, etc., for all measurable aspects of a device to be manufactured. However, rules in a manufacturing specification for determining whether particular layers are compliant or non-compliant with manufacturing requirements are particularly relevant to embodiments discussed herein. In the example of a front end of line (FEOL) layer (i.e., layers of a device formed before the first metallization and including device components such as transistors, resistors, capacitors, etc.), a manufacturing specification may include a "mask rule" for the layer to be produced. Mask rules refer to dimensional requirements and other measurements for determining whether a particular mask will cause mask inspection problems. In the example of a back end of line (BEOL) layer, i.e., layers of a device after the first metallization, e.g., layers containing wires and vias for coupling functional components together, a manufacturing specification may include a "design rule" for the layer to be produced. Design rules refer to minimum dimensions of devices and interconnects to be formed in an integrated circuit adopted during the design stage, and determined by the capabilities of process technology available. Mask rules and design rules are distinct from each other, e.g., by using different types of information about a layout to determine its compliancy or non-compliancy. Mask rules in particular examine an entire mask layout and the spatial relationship between multiple patterns in their final orientation, scale, and tone. In contrast, design rule analysis is usually performed on individual pattern files which may be used to form layouts.

The layout for a particular mask may be obtained from design data and/or generated, modified, etc., with the aid of optical proximity correction (OPC) or other design-enhancement systems. A "feature" generally refers to a functional element in an IC product (e.g., a wire) which must be printed on a wafer using photolithography techniques. A "region" refers to any subset of a given mask. A "pattern" or "feature pattern" refers to a design layout representation of one or more portions of a mask which define the features to be formed in a particular IC product, and which may be formed with the aid of a mask by way of, for example, direct-write electron beam lithography. The patterns in a mask may be structured and positioned to cover underlying materials, and thereby protect them from being etched away while other portions of a layer are being removed.

The term "fill region" refers to any set of features included in the design of a particular layer to fill empty space between other portions of a device. Fill regions may have a variety of material compositions and/or may be included to perform a wide variety of functions in a device which includes IC components therein. One example of a "fill region" may include a "dummy fill region" created to increase the feature density of a particular mask. "Feature density" may be expressed in a simplified form as the surface area of all features in a region of a layout divided by the surface area of the region under analysis. A higher feature density is generally desired for IC manufacture because non-selective processes for removing material from a layer (e.g., CMP as noted above) are less likely to encounter large portions of empty space, which may cause discrepancies between the processing of different regions. A design concern related to feature density is the "density gradient" of a layout, representing changes in feature density across different regions of a layout. Feature density may vary from region-to-region in a particular IC layout, and at times may indicate that a high-density region is located near a low-density region. Large differences in feature density over a small distance (e.g., high density gradients) may pose manufacturing risks, e.g., inconsistent applying of non-selective processes such as polishing, etching, etc.

A "fill cell" refers to a single two-dimensional body included in a mask to provide part of a fill region. A fill region thus may be defined as a collection of individual fill cells. Each fill cell may include metal(s), wires, features, mandrel structures, etc., for processing of the IC. Dummy fill regions in particular may lack functional electrical components of the device structure to be manufactured. Dummy fill regions thus do not provide any "active" functions, are almost never connected to power-ground, and thus have no bearing on the actual circuit design. A dummy fill region's purposes are thus to assist in CMP, and to a more limited extent aid in other lithographic processes and/or FEOL etch-color balancing. A "fill-dense region" generally refers to a portion of a layout with a particularly high number of fill cells distributed over a small surface area. In a fill-dense region, there is a significant possibility that the region's feature density may exceed an "allowable feature density" in a device's specification. Though regions with feature densities above the allowable density do not necessarily cause manufacturing limitations or defects, they may affect manufacturing when positioned next to other regions with low feature densities. A "target fill region" as discussed herein refers to a region of an IC layout which lacks fill cells (i.e., is completely vacant) and occupies a larger surface area than the layout's specification will accept. Target fill regions, as noted herein, are located adjacent to fill-dense regions and thus may provide a more suitable location for one or more fill cells in an adjacent fill-dense region.

FIG. 1 illustrates a plan view of an IC layout ("layout") 100 in plane X-Y, representing at least a portion of a mask to be used in the manufacture of one or more devices. Layout 100 may encompass a given surface area in plane X-Y, which may be filled with non-dummy features corresponding to portions of a device and/or fill regions for increasing the feature density in some regions as discussed above. Throughout the disclosure, "width" refers to the direction extending along in parallel with the X-axis, while "height" refers to the direction extending along or in parallel with the Y-axis. A foundry may desire for layout 100 to have minimal variation in feature density between adjacent regions. Layouts 100 with regions containing too many features (i.e., a high feature density region) positioned near large regions without any fill cells or functional features may create significant density gradients between adjacent regions in layout 100. Embodiments of the disclosure identify such design anomalies and modify layout 100 to prevent manufacturing defects. Methods according to the disclosure may analyze layout 100 or portions thereof to determine where fill cells may be removed from a fill-dense region and added to target fill regions which initially lack fill cells.

As shown in FIG. 1, layout 100 may include a target fill region 102 which does not include any printable features, as compared to a remainder of layout 100 which includes several fill cells 104 or other printable features. Embodiments of the disclosure may modify layout 100 by removing fill cells 104 from regions of layout 100 with high feature densities, and inserting duplicates of the removed fill cells 104 within target fill region 102. Target fill region 102 is defined as a region of layout 100 without fill cells, and exceeding a threshold surface area. Threshold surface area measurements which distinguish target fill regions 102 from other vacant regions of layout 100 may be determined by a user, calculated and stored in the memory of one or more computing devices, and/or otherwise may be accessible during implementation of the present disclosure. According to an example, a threshold surface area for target fill regions 102 in layout 100 may be any surface area in plane X-Y which lacks fill cells 104 and exceeds, e.g., approximately four square micrometers ($\mu m^2$). The threshold surface area may alternatively be defined in terms of the size of other areas in layout 100. For instance, a user may define the threshold surface area determinative of target fill regions 102 as a continuous vacant space that encompasses two or more individual fillable regions in layout 100. Although target fill region 102 has a rectangular shape in FIG. 1, this may not be true in all instances. In further embodiments, target fill region 102 may have rounded, triangular, composite, and/or non-Euclidean geometry in plane X-Y. Other portions of layout 100 which lack non-dummy features (e.g., fill cells 104) but have less than the threshold surface area may constitute vacant regions 106 of layout 100.

Layout 100 may represent, e.g., a FEOL layer or BEOL layer of a particular product, and the characteristics of the conventional process would be applicable to each type of layer. Functional features of layout 100 are not shown in FIG. 1 solely to emphasize fill cells 104. Fill cells 104 will be included in the same manufacturing layer as electrically functional components of a particular device. The foundry responsible for creating a product will attempt to include as many fill cells 104 as possible, so long as layout 100 complies with its corresponding specification(s).

The presence of target fill region 102 in layout 100 may allow one or more fill cells 104 to be relocated in target fill region 102 as discussed herein. Embodiments of the disclosure do not create new fill cells 104 or redesign the existing layout 100. Due to the presence of fill dense regions 110 with a feature density that is greater than a specified allowable feature density for a region, design rules may prohibit new fill cells 104 from being added to layout 100 unless others are taken away. Methods of the disclosure modify layout 100 from its original form to remove existing fill cells 104 for duplication in target fill region 102. Fill cells 104 thus may be removed from at least one fill-dense region 110 of layout 100 before being added to target fill region 102. As noted elsewhere herein, layout 100 may include one or more fill-dense region 110 with fill cells 104 and vacant regions 106. Fill-dense region 110 may have a feature density which is at least equal to a predetermined allowable feature density for layout 100. The predetermined allowable feature density may be set by a user, calculated through a computing device, and/or may otherwise be accessible during implementations of the present disclosure. One or more fill-dense regions 110 may be positioned adjacent to target fill region 102, creating an opportunity to move fill cells from fill-dense region(s) 110 to target fill region 102. That is, no other regions may be positioned in plane X-Y between a particular fill-dense region 110 and an "adjacent" target fill region 102. Upon identifying at least one target fill region 102 adjacent to at least one fill-dense region 110, embodiments of the disclosure may be implemented to modify layout 100 to reduce feature density gradients between adjacent regions in layout 100.

Figure 2:
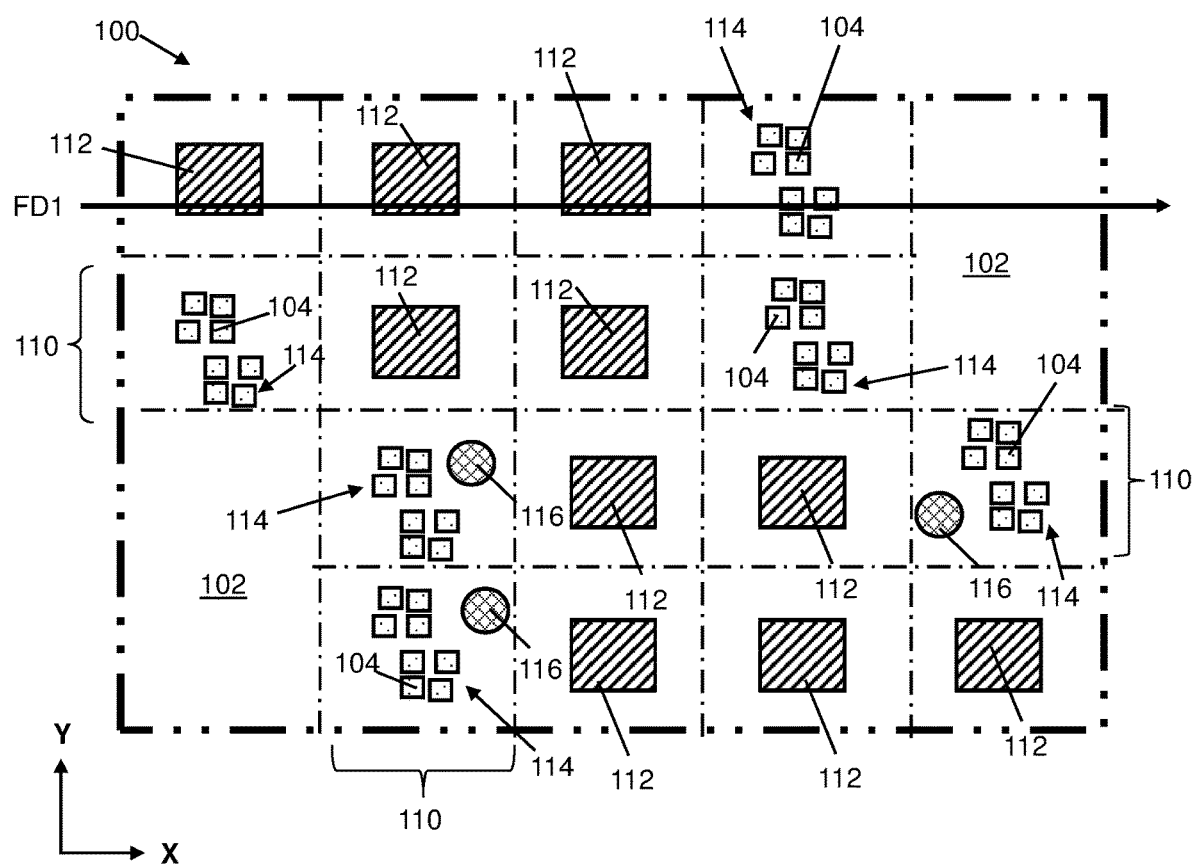
FIG. 2 provides a schematic view of multiple regions in an IC layout to be modified according to embodiments of the disclosure.

Turning to FIG. 2, another example of layout 100 suitable for modification is shown in plane X-Y. Layout 100 may be separated into distinct regions as shown by the various sets of phantom lines. Layout 100 in FIG. 2 may cover a scanning window of approximately twenty-five micrometers ($\mu m$) on X-axis by twenty-five $\mu m$ on Y-axis. The example layout 100 of FIG. 2 includes two target fill regions 102, i.e., regions without any fill cells 102 and having a surface area than is greater than a threshold value (e.g., more than four $\mu m^2$) as discussed by example herein. Layout 100 also includes several fill-dense regions 110 with fill cells 110. For the sake of example, each fill-dense region 110 is shown to be adjacent to one target fill region 102. Layout 100 may also include several non-dummy features 112 which may correspond to electrical components of an IC, e.g., wires, transistors, and/or other elements. Fill cells 104 in each fill-dense region 110 may be grouped into a plurality of fill cells 114. Some fill-dense regions 110 may also include non-dummy features corresponding to one or more functional elements of a device. In the example of FIG. 2, three fill-dense regions 110 each include a via cell 116. Via cell 116 represents an electrical connection between the layer depicted in layout 100 and a vertically adjacent layer of the same device. As discussed herein, some via cells 116 may be moveable to another position fill-dense region(s) 110, after one or more fill cells 104 are removed.

Embodiments of the disclosure may identify target fill regions 102 in layout 100 without applying a full design rule check (DRC) or using a graphic database system (GDS). The identifying of target fill regions 102, and other processes according to the disclosure, may rely on other physical parameters to identify regions with fillable empty space as target fill regions 102. Such processes may also be configured to select features for removal from fill-dense regions 110 and duplication within target fill regions 102. For example, the disclosure may include identifying all fill cells 104 and non-dummy features 112 in layout 100, and then merging all printable features in layout 100 into a single set of placeholder features for analysis. The method may then include increasing the size of all placeholder features by a predetermined percentage, e.g., fifty percent, to account for manufacturing variances, tolerance separation distances, etc. The size of any remaining empty space may then be compared with a threshold surface area (e.g., approximately four $\mu m^2$) to evaluate where target fill regions 102 exist in layout 100.

Figure 3:
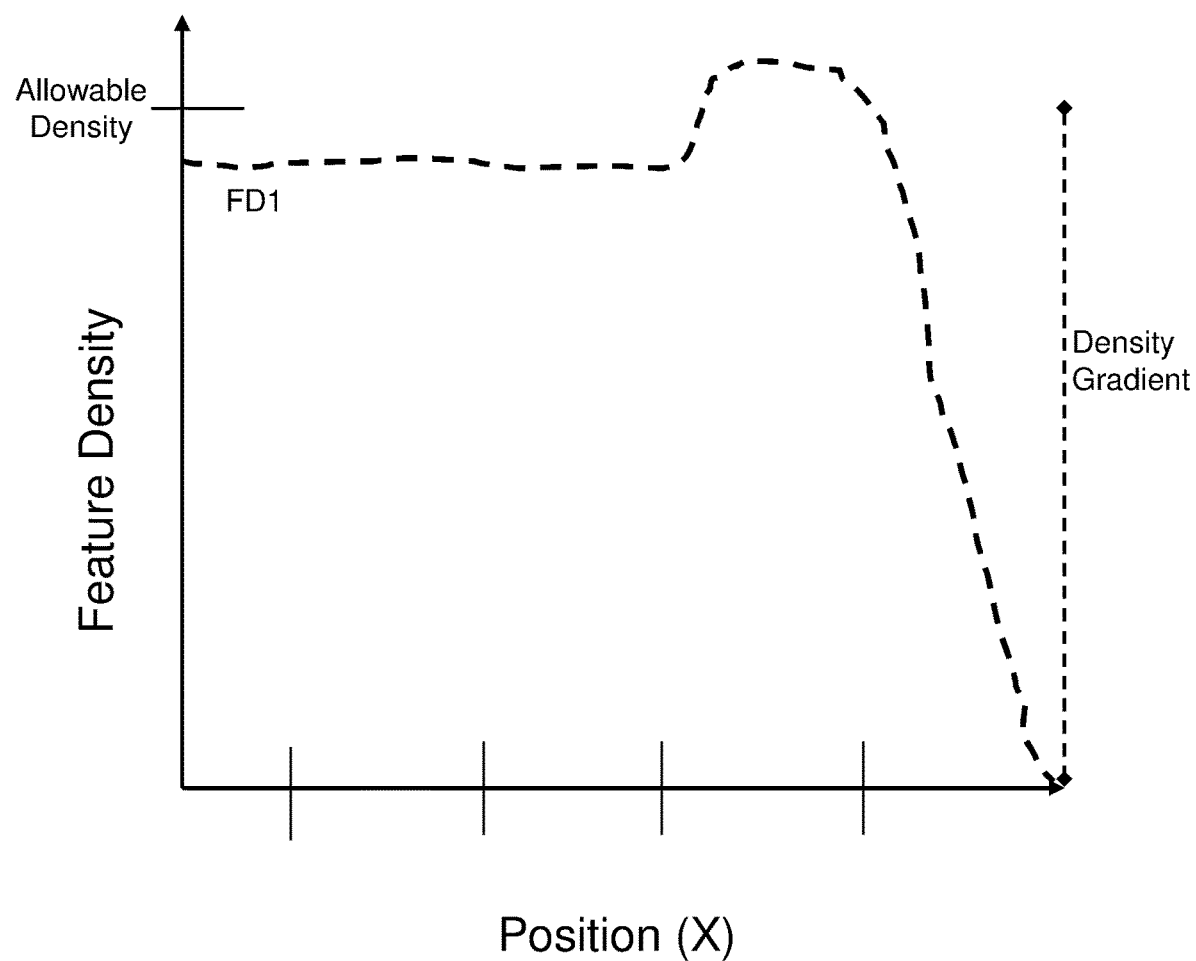
FIG. 3 provides a representative plot of feature density in multiple regions versus position along X-axis on line FD1 in FIG. 2.

Referring briefly to FIGS. 2 and 3 together, a plot of feature density versus position along X-axis for line FD1 in FIG. 2 is shown to illustrate technical problems addressed in the disclosure. Each hash mark on the X-axis in FIG. 3 represents the boundary between two regions in layout 100. Feature density (measured, e.g., as a ratio of fill and non-fill surface area to total surface area of a region) remains approximately constant over three regions with non-dummy features 112. Upon reaching fill-dense region 110, fill density increases to being more than an allowable feature density for layout 100, before steeply decreasing to zero within target fill region 102. These characteristics create an extreme density gradient between fill-dense region 110 and target fill region 102, and thus may impede uniform manufacturing of layout 100 when non-selective processes are implemented. It is not feasible to simply reduce the size of the scanning window for layout 100 to an even smaller value, e.g., four $\mu m$ by four $\mu m$, because such a reduction will consume an enormous amount of computational time, and because scanning a window of even smaller size may not be technically feasible. The feature density profile along the X-axis in FIG. 3 arises from layout 100 having target fill region(s) 102 positioned to fill-dense region(s) 110. Upon determining that layout 100 includes target fill region(s) 102 adjacent to fill-dense region(s) 110, embodiments of the disclosure modify layout 100 to remove fill cells 104 from fill-dense region(s) 110, and insert duplicates of the removed fill cells 104 within target fill region(s) 102. Layout 100 of FIG. 2 is provided as an example for modifying layout(s) 100 as discussed below.

Figure 4:
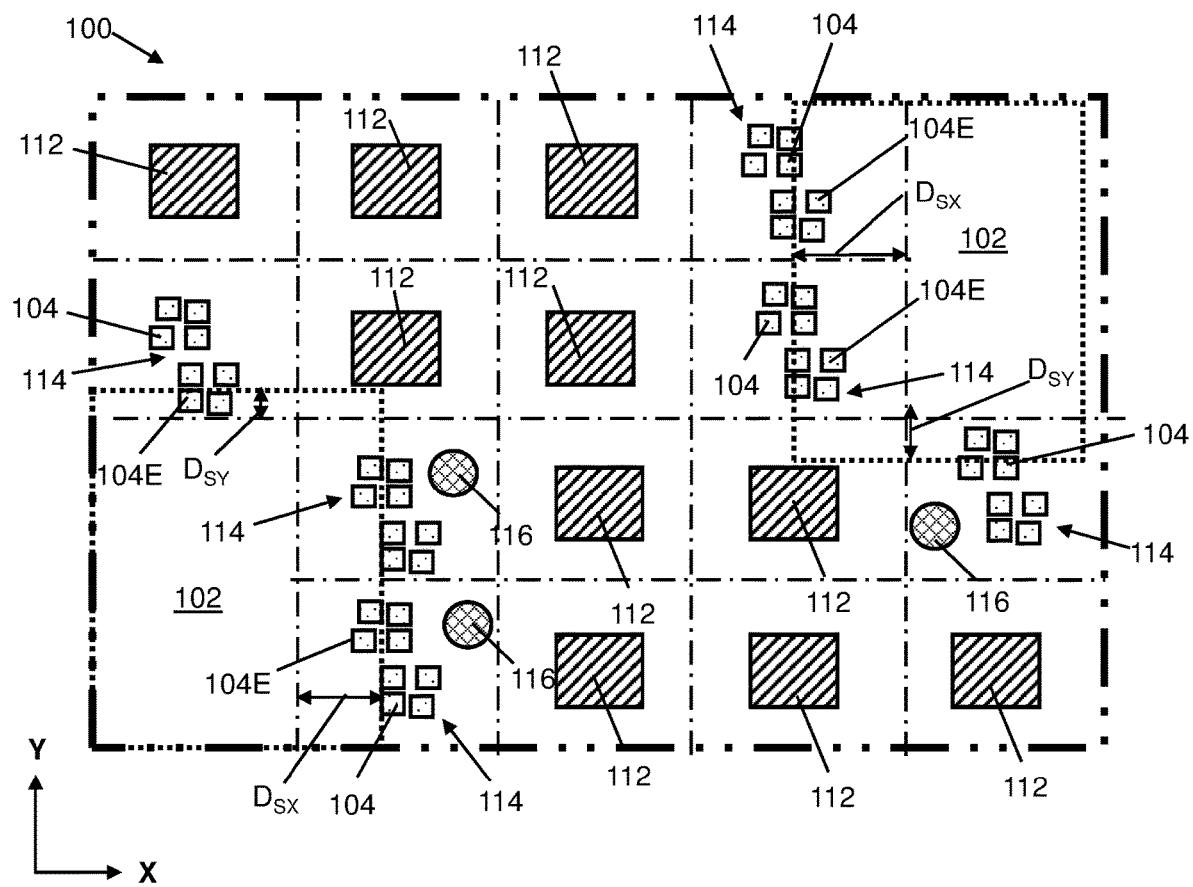
FIG. 4 provides a schematic view of the IC layout after removing fill cells from fill-dense regions according to embodiments of the disclosure.

Continuing to FIG. 4, the modifying of layout 100 may include analyzing various fill cells 104 in fill-dense region(s) 110 that are positioned adjacent to target fill region(s) 102 and thus capable of being removed and duplicated. For instance, methods according to the disclosure may analyze a portion of layout 100 which includes target fill region(s) 102 positioned alongside at least one adjacent fill-dense region(s) 110 to prepare layout 100 for modification. In an example, methods according to the disclosure may define a region for analysis which includes all fill cells 104 within a predetermined distance (e.g., $D_{SX}$ along the X-axis, $D_{SY}$ along the Y-axis) of target fill region(s) 102. To determine each distance $D_{SX}$, $D_{SY}$, the disclosure may additionally refer to the previously-discussed placeholder features with increased surface areas, and determine a difference in regional boundaries between layout 100 and the placeholder features. The difference between these boundaries may be applied to layout 100 as distance(s) $D_{SX}$, $D_{SY}$ without relying on other techniques for analyzing features in layout 100.

As shown in FIG. 4 by corresponding phantom lines, target fill regions 102 may be adjacent to several fill cells 104 in fill-dense regions 110 and may be located within distance(s) $D_{SX}$, $D_{SY}$ from target fill region 102 within plane X-Y. Fill cell(s) 104 within this region of space, however calculated, may be designated as candidate fill cells 104E suitable for being removed and duplicated within target fill region 102. Other fill cells 104 within each fill-dense region 110 may not be suitable for removal in this example. However, alternative embodiments may designate any fill cell in one fill-dense region 110 adjacent target fill region(s) 102 as being candidate fill cells 104E suitable for removal and duplication. As discussed herein, the disclosure may modify layout 100 by removing one or more candidate fill cells 104E from fill-dense region(s) 110, and then inserting a duplicate of each removed fill cell 104E within target fill region 102.

Figure 5:
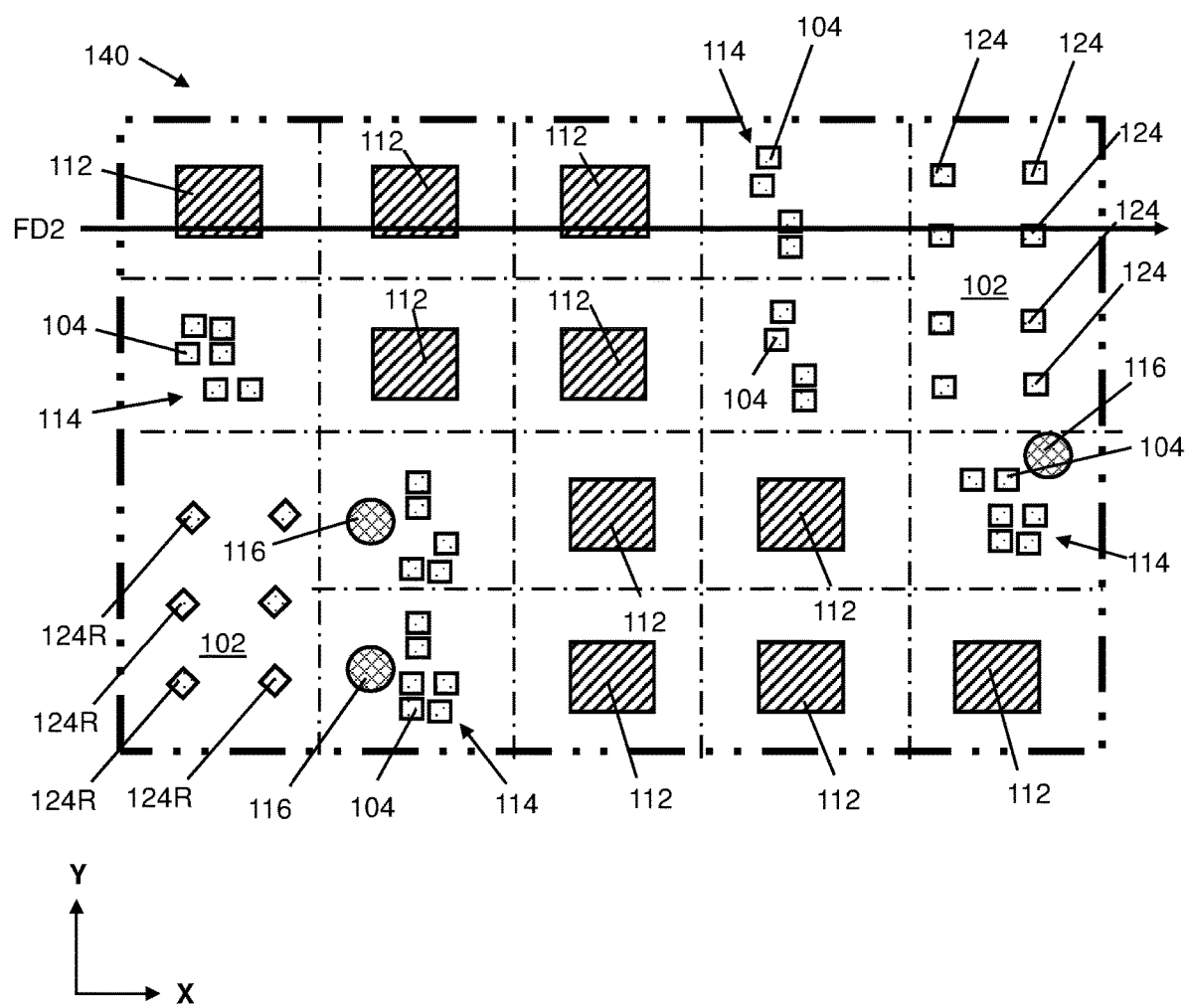
FIG. 5 provides a schematic view of the IC layout with duplicate fill cells in target fill regions according to embodiments of the disclosure.

FIGS. 4 and 5 together provide an example of modifying layout 100 (FIGS. 1-3 only) to remove fill cells 104 from fill-dense regions 110 and inserting duplicate fill cells 124 in target fill region 102. According to the example of FIG. 3, each candidate fill cell 104E within a predetermined distance from target fill region 102 may be removed from its corresponding fill-dense region 110. The removed cells may then be added to target fill region 102 as duplicate fill cells 124. According to further examples, the method may include selecting only a subset of candidate cells 104E for removal from fill-dense region(s) 110. For example, the method may include selecting and removing candidate cells 104E which lack any structural connection to via fill features positioned within other layers immediately above or below that of layout 100, or candidate fill cells 104E within a predetermined distance of via cells 116. Removing candidate fill cells 104E which lack connections to via fill shapes may be preferable, e.g., by not requiring any portions of dummy metal above or below layout 100 to be removed. The inserting of duplicate fill cells within target fill region 102 causes layout 100 to become a modified layout 140. To reduce variation in feature density throughout different regions of modified layout 140, the position of each duplicate fill cell 124 may be chosen to provide a uniform feature density throughout each target fill region 102. That is, duplicate fill cells 124 may be distributed throughout target fill region 102 with substantially uniform separation distances from each other, and without being clustered together in random or selected zones within target fill region 102. As discussed in further detail below, embodiments of the disclosure may initially remove and duplicate a predetermined number of candidate fill cells 104E from fill-dense region(s) 110 while leaving other candidate fill cells 104E intact. Upon determining that target fill region(s) 102 of modified layout 140 has reached a target feature density after adding duplicate fill cells 124, the method may include determining whether to remove other candidate fill cells 104E to create more duplicate fill cells in each target fill region 102. In some cases, the same number of candidate fill cells 104E may be removed from each fill-dense region 110. In this example, duplicate fill cells 124 inserted in target fill region 102 may include pairs of duplicate fill cells 124 previously removed from an adjacent fill-dense region 110. Methods of the disclosure may include inserting rotated duplicate fill cells 124R in target fill region 102, e.g., to finely adjust the feature density in target fill region 102 as compared to other regions in modified layout 140. Rotated duplicate fill cells 124R may differ from the angular orientation of their corresponding fill cells 104, e.g., by a predetermined difference in angular orientation relative to the X and/or the Y axis (e.g., thirty degrees, forty-five degrees, etc.). Rotated duplicate fill cells 124R may be particularly useful when rectangular candidate fill cells 104E are removed from fill-dense regions 110, and spatial constraints of layout 100 would otherwise prevent their duplicate fill cells 124 from having the same orientation in plane X-Y.

In addition to creating duplicate fill cells 124 in target fill regions 102, embodiments of the disclosure may affect other elements, and leave others intact, to create modified layout 140. For instance, the position of each non-dummy feature 112 may remain in a fixed position to prevent operational and/or manufacturing anomalies. Other features in layout 100, however, may be relocated to further adjust the feature density in each region without affecting the operational characteristics of a product. According to an example, one or more via cells 116 may be moveable to another location within fill-dense region 110. The prior removing of candidate fill cells 104E may create empty space where via cells 116 may be relocated to preserve some of the original feature density in fill-dense region(s) 110. In this case, via cell(s) 116 may have no structural connection to the removed candidate fill cells 104E. Notwithstanding the ability to change the position of via cell(s) 116 in embodiments of the disclosure, non-dummy features 112 may have fixed positions defined in layout 100.

Figure 6:
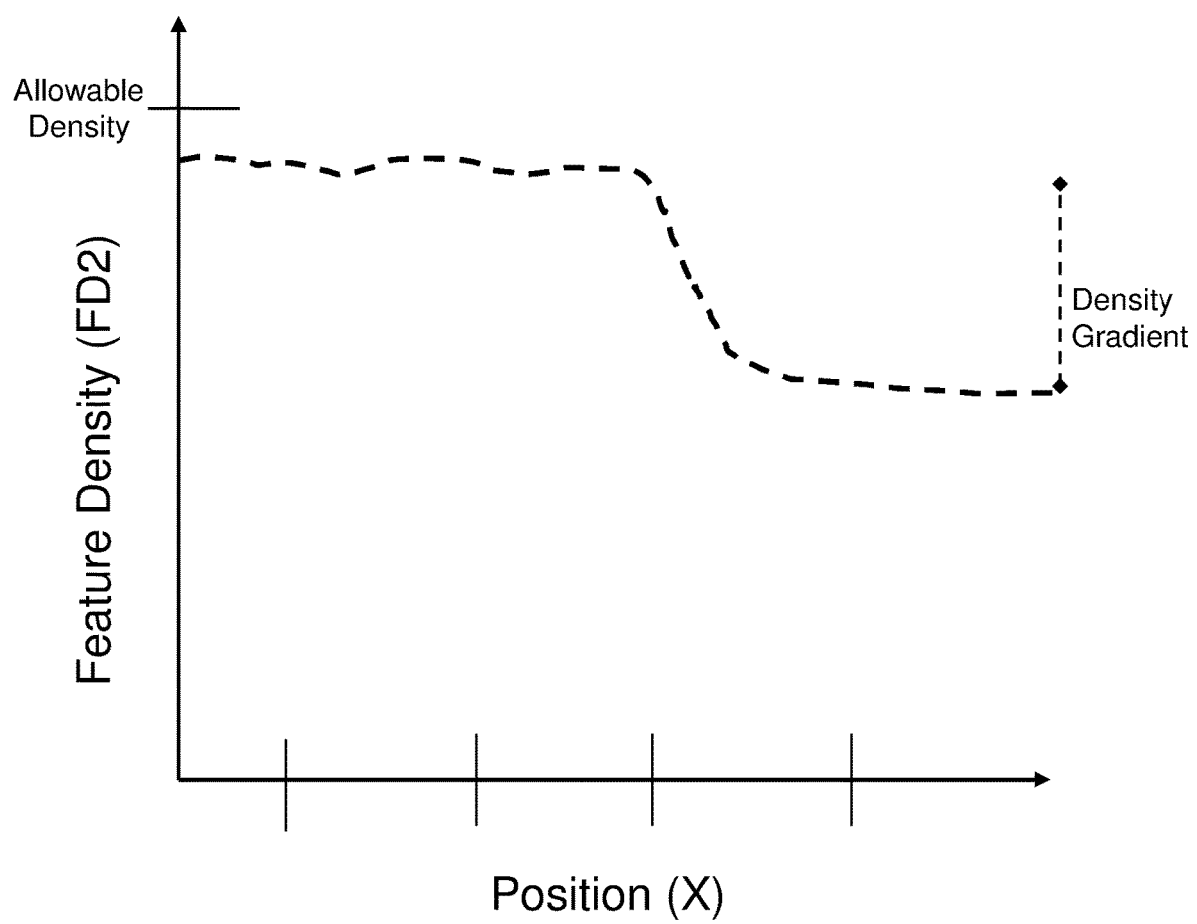
FIG. 6 provides a representative plot of feature density in multiple regions versus position along X-axis on line FD2 in FIG. 5.

Referring briefly to FIGS. 5 and 6 together, effects of removing fill cells 104 in fill dense regions and inserting duplicate fill cells 124 in target fill region 102 are shown. FIG. 6 illustrates the feature density of modified layout 140 relative to position along reference line FD2 of FIG. 5. Each hash mark on the X-axis in FIG. 6 represents the boundary between two regions in modified layout 140. FIG. 6 clearly shows that removing fill cells 104 from fill-dense region 110 causes the feature density in fill-dense region to be significantly less than the allowable feature density for modified layout 140. Additionally, the presence of duplicate fill cells 124 in target fill region 102 causes the density gradient along the X-axis to be much smaller than the original density gradient for layout 100 shown in FIG. 3. This uniformity of feature density in modified layout 140 thus improves uniformity of manufacturing without departing from the original circuit design.

Figure 7:
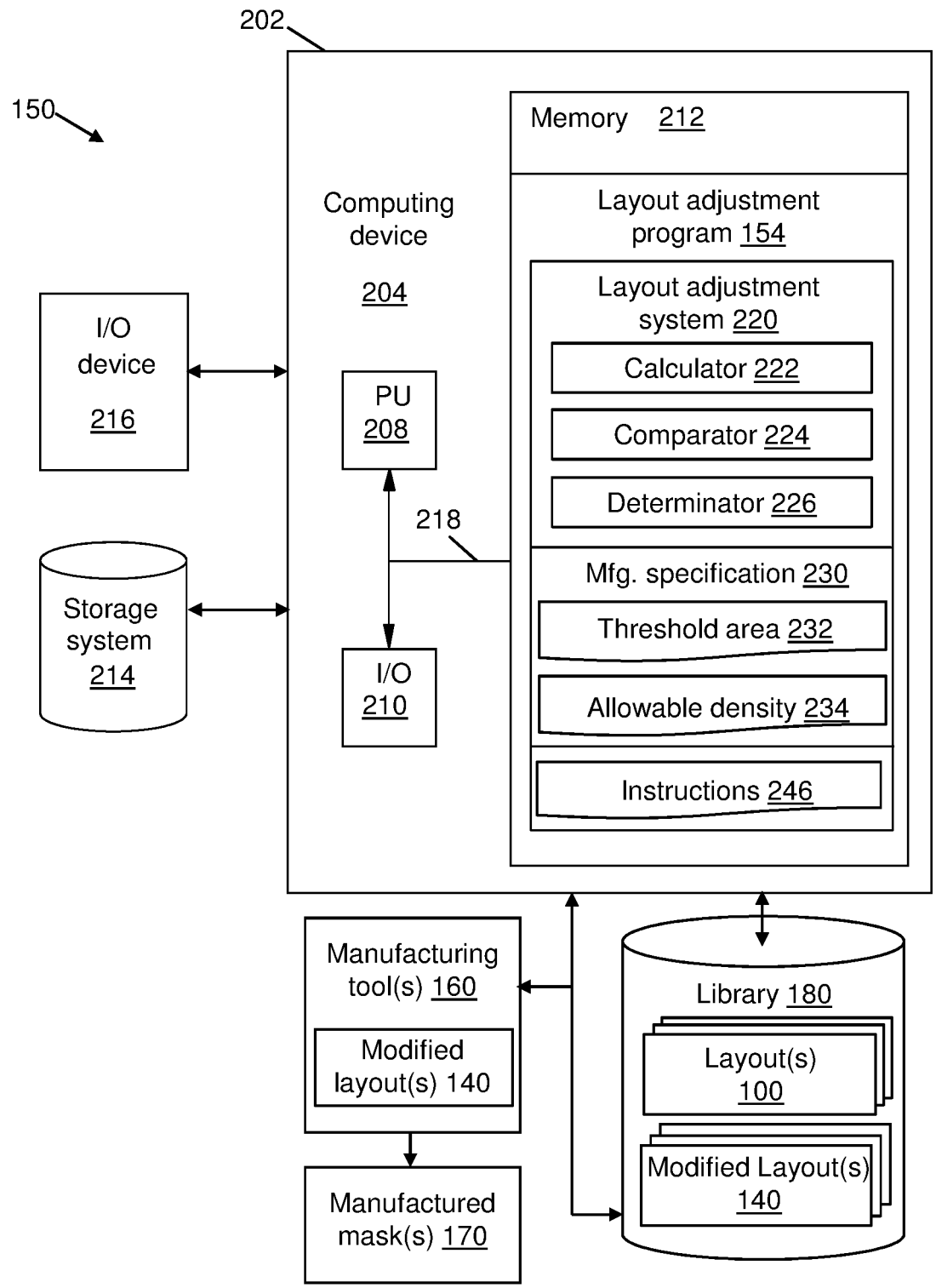
FIG. 7 depicts an illustrative environment, which includes a computer system configured to interact with a manufacturing tool and library for removing fill cells and inserting duplicates in target fill regions according to embodiments of the disclosure.

Referring to FIG. 7, an illustrative environment 150 for implementing the methods and/or systems described herein is shown. In particular, a computer system 202 is shown to include computing device 204. Computing device 204 may include, e.g., a layout adjustment program 154 which may include, e.g., one or more sub-systems (layout adjustment system 220, for performing any/all of the processes described herein and implementing any/all of the embodiments described herein.

Environment 150 may include a manufacturing tool 160 (e.g., a single manufacturing tool and/or a group of interconnected devices) configured to create a manufactured mask 170 from modified layout(s) 140. Manufactured mask 170 may include one or more duplicate fill cells 124 in target fill region(s) 102 as a result modifying layout(s) 100 to create modified layout(s) 140 in embodiments discussed herein. Environment 150 may also include a library 180 for storing layout(s) 100 and/or modified layout(s) 140. In accordance with embodiments of the disclosure, library 180 is connected to and modified by a layout adjustment program 154 including, e.g., one or more systems for creating modified layout(s) 140 from layout(s) 100. Layout adjustment program 154 may be housed, e.g., in a computer system 202, and the various systems and modules therein may operate through one or more processing techniques described herein. Layout adjustment program 154 may select particular layout(s) 100 for analysis, and remove non-selected regions to create modified mask(s) 140 as discussed herein. Computer system 202 may be in communication with library 180, e.g., according to any currently-known or later developed solution for communicating between data repositories (e.g., library 180), computer systems (e.g., computer system 202), and/or other data repositories discussed herein.

Computer system 202 can aid in the design and manufacture of IC products by converting one or more layout(s) 100 into modified layout(s) 140. The modifying of layout 140 may be accomplished by removing fill cells 104 (FIGS. 1, 2, 4, 5) from fill-dense regions 110 (FIGS. 1, 2, 4, 5) and inserting duplicate fill cells 124 (FIG. 5) in target fill region(s) 102 (FIGS. 1, 2, 4, 5). Modified layout(s) 140 may exhibit a more uniform feature density in each region of modified layout 140, without substantial feature density gradients. Layout adjustment program 154 may perform such functions, e.g., by processing data from library 180 for one or more layouts 100. Layout adjustment program 154 may generate instructions for adjusting manufacturing tool(s) 160, based on the resulting locations for each fill cell 104 and duplicate fill cell 124 in modified layout(s) 140. Manufacturing tool(s) 160 may thereafter create manufactured mask 180 based on modified layout 140, instead of layout 100. Modified layout(s) 140 may be stored, e.g., in memory components of computer system 202 for future use. Example procedures for modifying layout 100 to create modified layout 140 are provided in further detail below.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 may execute program code, such as layout adjustment program 154, which is at least partially fixed in memory 212. While executing program code, processing unit 208 may process data, which may result in reading and/or writing data from/to memory 212 and/or storage system 214. Pathway 218 provides a communications link between each of the components in environment 150. I/O component 210 may include one or more human I/O devices, which enable a human user to interact with computer system 202 and/or one or more communications devices to enable a system user to communicate with the computer system 202 using any type of communications link. To this extent, layout adjustment program 154 may manage a set of interfaces (e.g., graphical user interface(s), application program interface(s), etc.) that enable system users to interact with layout adjustment program 154. Further, layout adjustment program 154 may manage (e.g., store, retrieve, create, manipulate, organize, present, etc.) data, through several modules contained within a layout adjustment system 220. Layout adjustment system 220 is shown by example as being a sub-system of layout adjustment program 154.

As noted herein, layout adjustment program 154 may include layout adjustment system 220. In this case, modules 222, 224, 226, of layout adjustment system 220 may enable computer system 202 to perform a set of tasks used by layout adjustment program 154, and may be separately developed and/or implemented apart from other portions of layout adjustment program 154. Calculator 222 can implement various mathematical computations in processes discussed herein. Comparator 224 can compare two quantities and/or items of data in processes discussed herein. Determinator 226 may, e.g., make logical determinations based on compliance or non-compliance with various conditions in processes discussed herein. One or more modules 222, 224, 226, may use algorithm-based calculations, look up tables, software code, and/or similar tools stored in memory 212 for processing, analyzing, and operating on data to perform their respective functions. Each module discussed herein may obtain and/or operate on data from exterior components, units, systems, etc., or from memory 212 of computing device 204.

Layout adjustment program 154 may also include a catalogue of data expressed as a manufacturing specification ("mfg. specification") 230 which defines acceptable design characteristics and manufacturing parameters for layout(s) 100. As noted elsewhere herein, manufacturing specification 230 may include a listing of metrics for evaluating whether the design of each layout 100 is acceptable, e.g., acceptable amounts of feature density in each region, the largest allowable surface area to be unoccupied by fill cells, etc. Manufacturing specification 230 may be subdivided into different sets of rules, each corresponding to the type of mask represented in layout 100. Manufacturing specification may include several fields each corresponding to reference values for implementing embodiments of the disclosure. For example, a threshold area field 232 may define the minimum surface area for a region without fill cells that may be analyzed and modified as a target fill region 102. Threshold area filed 232 may include a minimum surface area (e.g., an area of four $\mu m^2$ as proposed elsewhere herein) and/or a minimum number of adjacent, identically-sized regions without any fill cells 104 therein. Manufacturing specification 230 may also include an allowable density field 234 which distinguishes fill-dense regions 110 from non-fill dense regions, in order to determine whether some fill cells 104 may be removed from layout 100 and duplicated in target fill region(s) 102. Other rules and/or forms of reference measurements, values, etc., may additionally or alternatively be stored in different fields of manufacturing specification 230. Layout adjustment system 220 and modules 222, 224, 226 thereof may cross-reference and apply data within manufacturing specification 230 to implement various processes according to the disclosure, e.g., determining whether target fill region(s) 102 and/or fill-dense regions 110 (FIGS. 1, 2, 4, 5) exist in layout(s) 100.

In addition to working in conjunction with manufacturing specification 230, layout adjustment system 220 may manipulate, interpret, and analyze various forms of information in library 180, including one or more existing layout(s) 100 for a particular mask layer or product. In addition, layout adjustment system 220 may generate modified layout(s) 140 by removing corner violation(s) 106 from each layout 100, and save modified layout(s) 140 in library 180. In further embodiments, layout adjustment program 154 may generate a set of instructions 246, and use instructions 246 to create modified layout(s) 140 from layout(s) 100 on library 180. Library 180 may form part of, or otherwise may be communicatively coupled to, computing device 204 through any individual or combination of physical and/or wireless data coupling components discussed herein. Some attributes of layout(s) 100 and/or modified layout(s) 140 may be converted into a data representation (e.g., a data matrix with several values corresponding to particular attributes) and stored electronically, e.g., within library 180, memory 212 of computing device 204, storage system 214, and/or any other type of data cache in communication with computing device 204.

Images and/or other representations of layout(s) 100 may additionally or alternatively be converted into data inputs or other inputs to layout adjustment program 154 with various scanning or extracting devices, connections to independent systems (e.g., library 180), and/or manual entry of a user. As an example, e.g., a user of computing device 204 could manually input layout(s) 100 and/or other forms of information to layout adjustment program 154. Layout adjustment program 154 of computing device 204 may output modified layout(s) 140 and/or instructions 246, and in some cases may automatically adjust manufacturing tool(s) 160 based on modified layout(s) 140 and/or instructions 246.

Computer system 202 may be operatively connected to or otherwise in communication with manufacturing tool(s) 160 having one or more manufacturing devices configured to construct IC masks from layouts 100 and modified layouts 120, e.g., as instructed by layout adjustment system 220 for preventing corner violations as discussed herein. Computer system 202 may be embodied as a unitary device in a semiconductor manufacturing plant coupled to manufacturing tool 160 and/or other devices, or may be multiple devices each operatively connected together to form computer system 202. Embodiments of the present disclosure may thereby include using layout adjustment program 154 to convert layout(s) 100 into modified layout(s) 140 by removing fill cells from fill-dense regions 110 and inserting duplicates of the removed cells into target fill regions 104. As discussed herein, embodiments of the present disclosure may provide instructions 246 for adjusting manufacturing tool(s) 160 based on modified layout(s) 140, e.g., based on where fill cells 104 are added and removed in each region 102, 110.

Where computer system 202 includes multiple computing devices, each computing device may have only a portion of layout adjustment program 154 and/or layout adjustment system 220 (including, e.g., modules 222, 224, 226) fixed thereon. However, it is understood that computer system 202 and layout adjustment system 220 are only representative of various possible equivalent computer systems that may perform a process described herein. Computer system 202 may obtain or provide data, such as data stored in memory 212 or storage system 214, using any solution. For example, computer system 202 may generate and/or be used to generate data from one or more data stores, receive data from another system, send data to another system, etc.

Referring to FIGS. 4, 5, 7, and 8 together, illustrative processes are shown for creating modified layout(s) 140 from layout(s) 100 to provide duplicate fill cells 124 in target fill region(s) 102. The steps and processes depicted in FIG. 8 may be implemented, e.g., with components of layout adjustment program 154, one or more modules 222, 224, 226 of layout adjustment system 220, and/or other components of computer system 202 described herein by example. A single and/or repeated execution of the processes discussed herein may allow for repeated use of manufacturing tool(s) 160 to manufacture masks for various layers and products while providing a more uniform feature density across each region of the mask. In the example processes discussed herein, layout 100 will generally be described as including at least one target fill region 102 adjacent to at least one fill-dense region 110, with some alternative examples referring to mask layouts with multiple target fill region(s) 102 and/or fill-dense region(s) 110 to be modified. It is also understood that the present disclosure may be implemented with respect to multiple layouts 100 simultaneously and/or sequentially, with each layout 100 including fill cells 104 with any conceivable dimensions, in any conceivable number, etc., and that other examples are discussed herein where appropriate.

The various processes discussed herein, furthermore, may be implemented before, during, or after other processes to construct and use masks in the manufacture of IC products. The methodology discussed herein may be implemented through alternative embodiments of computer system 202. For example, one library 180 may be used as a reference to modify multiple layouts 100 in embodiments of the disclosure. Multiple libraries 180 and/or layout adjustment programs 154 may alternatively be applied to one layout 100. Further alternative examples may include different combinations or numbers of layouts 100, libraries 180, layout adjustment programs 154, etc.

In a precursor action before implementing methods according to the disclosure, a designer may create layout(s) 100 and the features therein. In the example of forming layout(s) 100 to include a minimum feature density, the designing of layout(s) may begin with designing and placing non-dummy features 112 to provide the functional characteristics of a layer. In this case, the next phase of designing layout(s) 100 may include forming and placing fill cell(s) 104 in the vacant space between non-dummy features 112 to increase the feature density of a region in layout(s) 100. Process P1 in some cases may be implemented independently, e.g., by a separate manufacturing entity, before being provided to a circuit analysis entity to implement the analysis techniques described herein. Process P1 is therefore shown in phantom to illustrate this optional process according to embodiments. Layout(s) 100 may be submitted to manufacturing tool 160 and/or computer system 202, e.g., as inputs to I/O device 216 through a computer-readable storage medium and/or other computer-readable inputs to computer system 202. Computer system 202, in turn, can instruct manufacturing tool 160 delay the manufacture of layout(s) 100 until further processes according to the disclosure are completed. Embodiments of the disclosure thus permit computer system 202 and its components to modify layout 100 before manufacturing any masks based on the original layout(s) 100, e.g., by implementing the steps discussed herein along with various conventional processing techniques including design rule checking, mask rule checking, etc., as noted above to reduce the number of projected defects before manufacture.

Methods of the disclosure may include analyzing layout 100 to determine whether fill cells 104 therein could be moved to other locations, to provide a more uniform feature density across each feature in layout 100. During this process, comparator 224 of layout adjustment system 220 may compare each region of layout 100 without fill cells 104 with a threshold surface area, e.g., defined in threshold area field 232 of manufacturing specification 230. Such regions may be designated target fill regions 102 of layout 100. According to an example, each target fill region may have a surface area in plane X-Y that is at least four $\mu m^2$, at least equal to the size of two regions having non-dummy features 112 therein, etc. Embodiments of the disclosure need not be implemented on layout(s) 100 which do not have target fill regions 102. Where comparator 224 indicates that no target fill regions exist in layout 100 ("No" at process P2), the methodology may proceed to an alternative process P3 of manufacturing the IC mask(s) using layouts 100 which do not have any target fill regions 102 as defined in manufacturing specification 230.

Where comparator 224 indicates that one or more target fill regions 102 exist in layout 100 ("Yes" at process P2), the methodology instead proceeds to a process P4 in which determinator 226 determines whether fill-dense regions 110 appear in layout 100 adjacent to target fill region(s) 102. As noted above, fill-dense regions 110 may be defined in manufacturing specification 230 as any region with fill cells 104 therein, and exceeding an allowable feature density for each region of layout 100. Allowable density field 234 of manufacturing specification 230 may define whether a particular region is a fill-dense region 110 or not a fill-dense region 110. In the event that layout 100 does not include any fill-dense regions 110 adjacent to at least one target fill region 102 ("No" at process P4), the method may proceed to process P3 of manufacturing layout 100 in its original form without further modifications. Where determinator 226 determines that at least one fill-dense region 110 is adjacent to at least one target fill region 102 ("Yes" at process P4), the method may proceed by modifying layout 100 to create modified layout 140.

Figure 8:
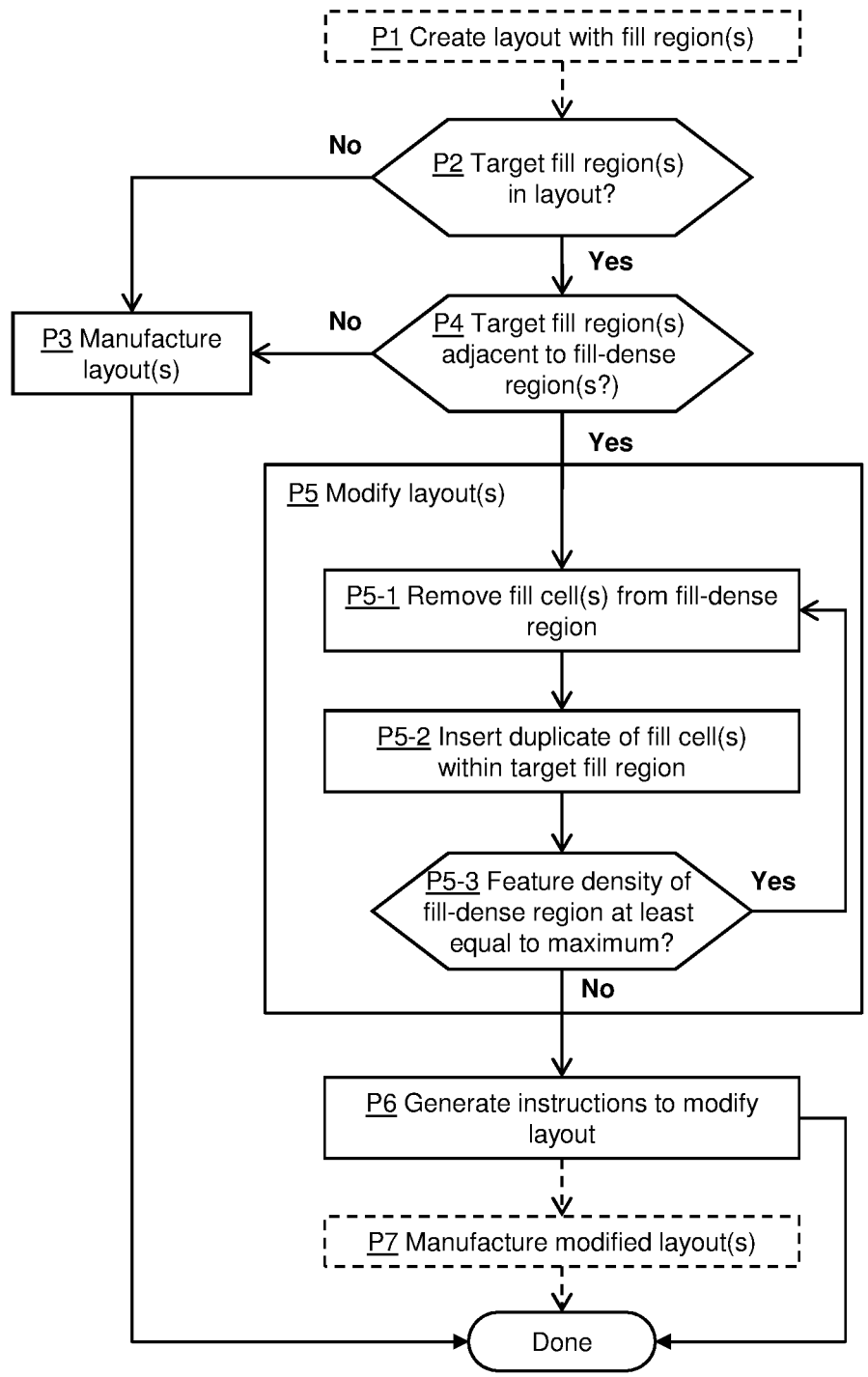
FIG. 8 provides an example flow diagram of a method for implementing methods according to embodiments of the disclosure.

Upon determining that target fill region(s) 102 appear adjacent to one or more fill-dense region(s) 110 in layout 100, the method includes a process P5 of modifying layout 100 to provide modified layout 140. Process P5 may be divided into sub-processes P5-1, P5-2, P5-3 as shown in FIG. 8, though the details of each sub-process may be modified, reordered, etc., without departing from the underlying concepts and features of process P5 discussed herein. First sub-process P5-1 involves layout adjustment system 220 removing one or more fill cells 104 from fill-dense region(s) 110. The removed fill cells 104 may be selected for removal, e.g., by being within predetermined distance(s) $D_{sx}$, $D_{sy}$ (FIG. 4) in plane X-Y as noted above. Sub-process P5-1 causes the removed fill cells 104 to no longer appear in layout 100. Sub-process P5-2 involves layout adjustment system 220 inserting duplicate fill cells 124 in target fill region 102 to replace any fill cells 104 removed in sub-process P5-1. The result of sub-processes P5-1, P5-2 is shown by example in FIG. 5, and discussed above. A final sub-process P5-3 involves comparator 224 comparing the feature density of fill-dense region 110 with the allowable feature density for the same region as defined in manufacturing specification 230 (e.g., in allowable density field 232).

Where fill-dense region 110 still exceeds the allowable feature density ("Yes" at sub-process P5-3), the method may repeat sub-processes P5-1 and P5-2. Where each fill-dense region 110 under analysis has a feature density that is at most equal to the allowable feature density ("No" at sub-process P5-3), the resulting layout is designated as modified layout 140 and the method proceeds to other processes.

After fill cells 104 of layout 100 are processed to create modified layout 140, layout adjustment system 220 may implement further steps to manufacture a device using modified layout 140, including duplicate fill cells 124 in target fill regions in place of the removed fill cells 104. According to one non-limiting example shown by the phantom process flow in FIG. 8, the methodology may continue to a process P6 of generating instructions 246, indicative of modified layout 140, to be submitted to manufacturing tool(s) 160. Instructions 246 may take the form of computer code for altering the original form of layout 100 as expressed in manufacturing tool 160, a two-dimensional map of features to be printed in place of the original layout 100, and/or any other currently known or later developed process to replace layout 100 with modified layout 140. Instructions 246 can be based at least in part on, e.g., the location(s) where duplicate fill cells 124 are added to target fill regions 102, the new location of fill cells 104 and other features (e.g., via cells 114) in fill-dense regions 110, a listing of changes in modified layout(s) 140 relative to the original layout(s) 100, etc. Instructions 246 thus may change various settings of manufacturing tool(s) 160 in process P7 such as etch time, deposition time, fill shape or printing area, and/or other properties of layout 100 to create modified layout 140.

A final step of the method may include process P7 of manufacturing mask(s) 180 based on modified layout 140. Process P7 may include, e.g., using manufacturing tool 160 to produce manufactured mask 180 based on modified layout 140 using instructions 246 from process P6. In further embodiments, it may be possible to use modified layout(s) 140 in manufacture without the aid of instructions 246. For example, manufacturing tool(s) 160 may not receive layout(s) 100 in their original form, and may simply receive modified layout(s) 140 after the conclusion of process P6. In this case, manufacturing tool(s) 160 uses only modified layout(s) 140 to create manufactured mask(s) 160, and no layout(s) 100 are transmitted to manufacturing tool 160 unless they have target fill regions 102 or fill-dense regions 110 adjacent to target fill regions 102. In any case, the method may then conclude ("Done"), or may repeat after additional layouts 100 are provided to layout adjustment system 154 for analysis.

Figure 9:
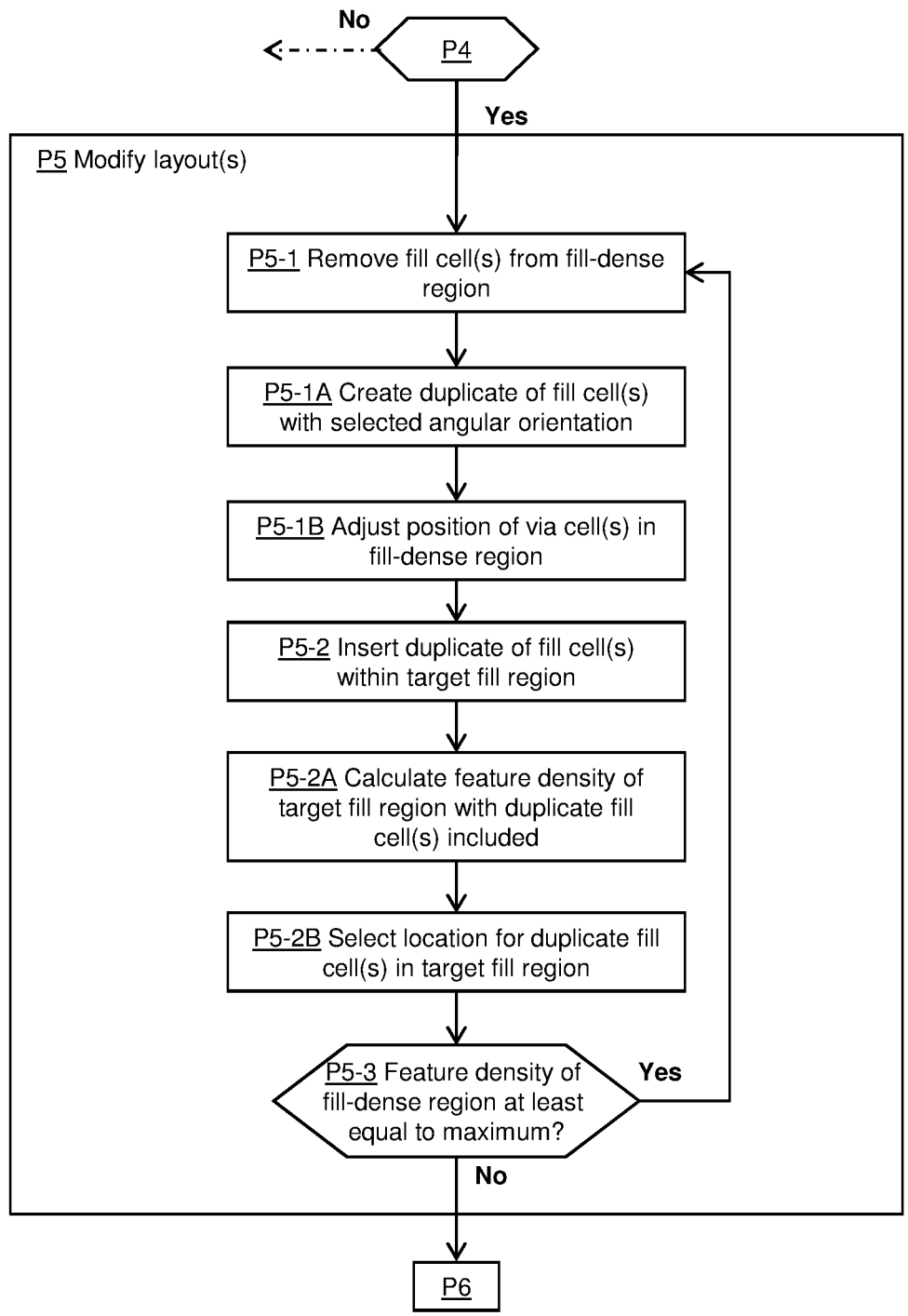
FIG. 9 provides and expanded flow diagram of processes to modify an IC layout according to embodiments of the disclosure.

Referring to FIG. 9, process P5 of modifying layout(s) 100 to create modified layout(s) 140 may optionally include additional sub-processes P5-1A, P5-1B, P5-2A, and/or P5-2B. Sub-processes P5-1A, P5-1B, P5-2A, P5-2B are shown in the example order of FIG. 9 to illustrate alternative methods according to the disclosure, and it is understood that each sub-process of process P5 may be implemented in a different order and/or omitted entirely in varying applications. One sub-process P5-1 involves creating duplicate fill cell(s) 124 to have a different angular orientation in plane X-Y from their corresponding fill cell 104. Sub-process P5-1 may include calculator 222 calculating an amount by which each duplicate fill cell 124 is rotated before insertion in target fill region 102. In an example embodiment, rotating duplicate fill cell(s) 124 may allow target fill region 102 to reduce the overall density gradient between regions of layout 100 based on, e.g., the position of fill cells 104 remaining in fill-dense regions 110. Duplicate fill cells 124 may differ from their corresponding fill cells 104 by a predetermined angular differential, e.g., thirty degrees, forty-five degrees, etc.

Another optional sub-process P5-1B may include using layout adjustments system 220 to adjust the position of via cells 116 in fill-dense region(s) 110, after fill cell(s) 104 have been removed therefrom. As noted above, via cells 116 may be moveable to other locations in fill-dense region(s) after fill cell(s) 104 have been removed. Moving via cells 116 in this manner may compensate for some reductions in a region's feature density after fill cell(s) 104 have been removed from fill-dense region(s) 110. The moving of via cells 116 may be accomplished, e.g., by selecting a new location for via cell(s) 116 in fill-dense region(s) 110. Calculator 222 may calculate a new position for via cell(s) 116 in fill-dense region(s) 110 automatically after fill cell(s) 104 are removed. Alternatively, a user may manually select a new location for one or more via cell(s) 116 in fill-dense region(s) 110.

Other optional sub-processes P5-2A, P5-2B may be implemented to further improve the manufacturability of modified layout(s) 140. Sub-process P5-2A involves calculator 222 calculating a feature density of target fill region 102 with duplicate fill cell(s) 124 included therein. The new feature density of target fill region 102 may mitigate variance in the feature density across layout 100 at target fill regions 102. In some cases, target fill region(s) 102 may be adjacent to more fill-dense regions 110 at one location than at other locations. Such instances may include, e.g., several fill-dense regions 110 being adjacent to target fill region 102 being next to one corner but no fill-dense regions 110 being adjacent to another corner of target fill region 102. In this case, the method may proceed to process P5-2B where layout adjustment system 220 selects a location for duplicate fill cells 124 in target fill region 102. Calculator 222 may mathematically compute a site for duplicate fill cell 124 which minimizes the resulting feature density gradient between target fill regions 102 and fill-dense regions 110. In one example, process P5-2B may involve placing several duplicate fill cells 124 in target fill region 102 at a location near fill-dense region 110, while placing fewer or no duplicate fill cells 124 in target fill region near other regions. In this manner, a fabricator may provide a more uniform distribution of fill cells 104 and duplicate fill cells 124 across modified layout 140. The remaining sub-processes of P5 may be implemented pursuant to other embodiments discussed herein, regardless of whether some or all of the various optional sub-processes are included in a particular implementation.

As will be appreciated by one skilled in the art, aspects of the present disclosure may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, e.g., verification languages such as Calibre, ICV, and/or PVS. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As used herein, the term "configured," "configured to" and/or "configured for" may refer to specific-purpose patterns of the component so described. For example, a system or device configured to perform a function may include a computer system or computing device programmed or otherwise modified to perform that specific function. In other cases, program code stored on a computer-readable medium (e.g., storage medium), may be configured to cause at least one computing device to perform functions when that program code is executed on that computing device. In these cases, the arrangement of the program code triggers specific functions in the computing device upon execution. In other examples, a device configured to interact with and/or act upon other components may be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component may aid in performing a function, for example, displacement of one or more of the device or other component, engagement of one or more of the device or other component, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   determining whether an integrated circuit (IC) layout having a plurality of fill cells includes a target fill region, the target fill region being a region of the IC layout without fill cells and exceeding a threshold surface area;
   in response to determining that the IC layout includes the target fill region, determining whether the target fill region is positioned adjacent to a fill-dense region, the fill-dense region being a region of the IC layout including a subset of the plurality of fill cells, and having a feature density at least equal to an allowable feature density for the IC layout, wherein feature density is defined as the ratio of fill cell surface area within a region to a total surface area of the region;
   in response to determining that the IC layout does not include the target fill region, or the target fill region not being positioned adjacent to the fill-dense region, providing instructions to manufacture an IC using the IC layout;
   in response to determining that the target fill region is positioned adjacent to the fill-dense region, modifying the IC layout, wherein the modifying includes:
     removing one of the plurality of fill cells from the fill-dense region, and
     inserting a duplicate of the removed one of the plurality of fill cells within the target fill region;
   determining whether the feature density of the fill-dense region is at least equal to the allowable feature density for the IC layout;
   in response to determining that the feature density of the fill-dense region is at least equal to the allowable feature density for the IC layout, repeating the modifying of the IC layout; and
   in response to determining that the feature density of the fill-dense region is less than the allowable feature density of the IC layout, providing instructions to manufacture an IC using the modified IC layout.

2. The method of claim 1, wherein the modifying further includes creating the duplicate of the removed one of the plurality of fill cells to have a different angular orientation from the removed one of the plurality of fill cells.

3. The method of claim 1, wherein the modifying further includes adjusting a position of a via cell within the fill-dense region after the removing, wherein the removed one of the plurality of fill cells is free of connections to the via cell.

4. The method of claim 1, further comprising manufacturing the IC using a manufacturing device and the provided instructions.

5. The method of claim 1, wherein the fill-dense region comprises one of a plurality of fill-dense regions each having a respective subset of the plurality of fill cells, and wherein removing one of the plurality of fill cells comprises removing at least one fill cell from each of the plurality of fill-dense regions.

6. The method of claim 5, wherein the modifying further includes inserting a duplicate fill cell for each removed fill cell from the plurality of fill-dense regions.

7. The method of claim 1, wherein the modifying further includes:
   calculating a feature density of the target fill region with the inserted duplicate fill cell included; and
   selecting a location for the duplicate of the removed one of the plurality of fill cells within the target fill region based on the calculated feature density of the target fill region.

8. A computer program product stored on a computer readable storage medium, the computer program product comprising program code, which, when being executed by at least one computing device, causes the at least one computing device to:

determine whether an integrated circuit (IC) layout having a plurality of fill cells includes a target fill region, the target fill region being a region of the IC layout without fill cells and exceeding a threshold surface area;

in response to determining that the IC layout includes the target fill region, determine whether the target fill region is positioned adjacent to a fill-dense region, the fill-dense region being a region of the IC layout including a plurality of fill cells, and having a feature density at least equal to an allowable feature density for the IC layout, wherein feature density is defined as the ratio of fill cell surface area within a region to a total surface area of the region;

in response to determining that the IC layout does not include the target fill region, or the target fill region not being positioned adjacent to the fill-dense region, provide instructions to manufacture an IC using the IC layout;

in response to determining that the target fill region is positioned adjacent to the fill-dense region, modify the IC layout by performing actions including:
  removing one of the plurality of fill cells from the fill-dense region, and
  inserting a duplicate of the removed one of the plurality of fill cells within the target fill region;

determining whether the feature density of the fill-dense region is at least equal to the allowable feature density for the IC layout;

in response to determining that the feature density of the fill-dense region is at least equal to the allowable feature density for the IC layout, repeat the modifying of the IC layout; and in response to determining that the feature density of the fill-dense region is less than the allowable feature density of the IC layout, provide instructions for a manufacturing device to manufacture an IC using the modified IC layout.

9. The computer program product of claim 8, wherein the modifying further includes creating the duplicate of the removed one of the plurality of fill cells to have a different angular orientation from the removed one of the plurality of fill cells.

10. The computer program product of claim 8, wherein the modifying further includes adjusting a position of a via cell within the fill-dense region after the removing, wherein the removed one of the plurality of fill cells is free of connections to the via cell.

11. The computer program product of claim 8, wherein the fill-dense region comprises one of a plurality of fill-dense regions each having a respective subset of the plurality of fill cells, and wherein removing one of the plurality of fill cells comprises removing at least one fill cell from each of the plurality of fill-dense regions.

12. The computer program product of claim 11, wherein the modifying further includes inserting a duplicate fill cell for each removed fill cell from the plurality of fill-dense regions.

13. The computer program product of claim 8, wherein the modifying further includes:
  calculating a feature density of the target fill region with the inserted duplicate fill cell included; and
  selecting a location for the duplicate of the removed one of the plurality of fill cells within the target fill region based on the calculated feature density of the target fill region.

14. A system comprising:
  a computing device;
  an I/O component operatively coupled to the computing device; and
  a memory operatively coupled to the computing device,
  wherein the computing device includes logic and is configured to perform a method including:
    determining whether an integrated circuit (IC) layout having a plurality of fill cells includes a target fill region, the target fill region being a region of the IC layout without fill cells and exceeding a threshold surface area;
    in response to determining the IC layout includes the target fill region, determining whether the target fill region is positioned adjacent to a fill-dense region, the fill-dense region being a region of the IC layout including a plurality of fill cells, and having a feature density at least equal to an allowable feature density for the IC layout, wherein feature density is defined as the ratio of fill cell surface area within a region to a total surface area of the region;
    in response to determining that the IC layout does not include the target fill region, or the target fill region not being positioned adjacent to the fill-dense region, providing instructions to manufacture an IC using the IC layout;
    in response to determining that the target fill region is positioned adjacent to the fill-dense region, modifying the IC layout, wherein the modifying includes:
      removing one of the plurality of fill cells from the fill-dense region, and
      inserting a duplicate of the removed one of the plurality of fill cells within the target fill region;
    determining whether the feature density of the fill-dense region is at least equal to the allowable feature density for the IC layout;
    in response to determining that the feature density of the fill-dense region is at least equal to the allowable feature density for the IC layout, repeating the modifying of the IC layout; and
    in response to determining that the feature density of the fill-dense region is less than the allowable feature density of the IC layout, providing instructions for a manufacturing device to manufacture an IC using the modified IC layout.

15. The system of claim 14, wherein the modifying further includes creating the duplicate of the removed one of the plurality of fill cells to have a different angular orientation from the removed one of the plurality of fill cells.

16. The system of claim 14, wherein the modifying further includes adjusting a position of a via cell within the fill-dense region after the removing, wherein the removed one of the plurality of fill cells is free of connections to the via cell.

17. The system of claim 14, wherein the method further includes manufacturing the IC using the manufacturing device and the provided instructions.

18. The system of claim 14, wherein the fill-dense region comprises one of a plurality of fill-dense regions each having a respective subset of the plurality of fill cells, and wherein removing one of the plurality of fill cells comprises removing at least one fill cell from each of the plurality of fill-dense regions.

19. The system of claim 18, wherein the modifying further includes inserting a duplicate fill cell for each removed fill cell from the plurality of fill-dense regions.

20. The system of claim 14, wherein the modifying further includes:
- calculating a feature density of the target fill region with the inserted duplicate fill cell included; and
- selecting a location for the duplicate of the removed one of the plurality of fill cells within the target fill region based on the calculated feature density of the target fill region.

* * * * *